United States Patent [19]

Chan et al.

[11] Patent Number: 5,441,617
[45] Date of Patent: Aug. 15, 1995

[54] ANODIC ARC SOURCE CONTAINMENT MECHANISMS

[75] Inventors: Chung Chan, Newton; Ryne C. Allen, West Roxbury, both of Mass.

[73] Assignee: Northeastern University, Boston, Mass.

[21] Appl. No.: 226,178

[22] Filed: Apr. 11, 1994

Related U.S. Application Data

[63] Continuation-in-part of Ser. No. 934,925, Aug. 25, 1992, Pat. No. 5,302,271.

[51] Int. Cl.[6] .............................................. C23C 14/32
[52] U.S. Cl. .......................... 204/192.38; 204/298.41; 427/580
[58] Field of Search ...................... 204/192.38, 298.41; 427/580

[56] References Cited

U.S. PATENT DOCUMENTS

| | | | |
|---|---|---|---|
| 3,158,805 | 11/1964 | Kalbfell | 360/1 |
| 4,917,786 | 4/1990 | Ehrich | 204/192.38 |
| 5,013,578 | 5/1991 | Brown et al. | 427/455 |
| 5,096,558 | 3/1992 | Ehrich | 204/192.38 |
| 5,215,640 | 6/1993 | Buhl et al. | 204/192.38 |
| 5,269,896 | 12/1993 | Munemasa et al. | 204/192.38 |
| 5,317,235 | 5/1994 | Treglio | 315/111.41 |

OTHER PUBLICATIONS

"A Review of Anode Phenomena in Vacuum Arcs", by H. Craig Miller, IEEE Transactions on Plasma Science, vol. PS-13, Oct. 1985, pp. 242-252.
"Corrosion Protection By Vacuum Arc Coatings", by S. Bababeyge, et al., Interfinish 88, Paris, Oct. 1988.
"Transport of Vacuum Arc Plasma Through Straight and Curved Magnetic Cuts", by J. Storer, et al., Journal of Applied Physics, vol. 66, No. 11, Dec. 1989, pp. 5245-5250.
"Anode Voltage Drop and Anode Spot Formation in dc Vacuum Arcs" by C. W. Kimblin, Journal of Applied Physics, vol. 40, No. 4, Mar. 1969, pp. 1744-1752.
"The Anode Vacuum Arc. I. Basic Construction and Phenomenology", by H. Ehrick, Jun. 1987, pp. 134-138.
"The Anodic Vacuum Arc. II. Experimental Study of Arc Plasma", by H. Ehrick, et al., Sep. 1987, pp. 2499-2502.
"Principles and Applications of Vacuum Arc Coatings", by R. L. Boxman, et al., XIIIth Internation Symposium on Discharges and Electrical Insulation in Vacuum, Paris, 1988.
"Anode Surface Radiance From Microsecond Vacuum Arcs", by J. T. Grissom, et al., Journal of Applied Physics, vol. 45, No. 7, Jul. 1974, pp. 2885-2894.
"Vacuum Arc Anode Plasma. I. Spectroscopic Investigation", by F. M. Bacon, Journal of Applied Physics, vol. 46, No. 11, Nov. 1975, pp. 4750-4757.

*Primary Examiner*—Aaron Weisstuch
*Attorney, Agent, or Firm*—Weingarten, Schurgin, Gagnebin & Hayes

[57] ABSTRACT

An anodic vacuum arc deposition system for rapidly depositing a high quality, small grain size, coating on a workpiece. The anodic vacuum arc deposition system includes an arc initiator and an anodic electrode having a continuous feed. The anodic vacuum arc deposition system may be configured with a coaxial anode and cathode. A plurality of coaxial electrodes may used to coat a large area and/or to simultaneously deposit two or more different materials for multi-layer or alloy coating. Several material recovery systems including both methods and devices for recovery of the undeposited anodic arc coating material minimize the anode source waste such that selective coatings may be applied with virtually all excess coating material recovered for reuse. In one embodiment, an anode shield is made of the same material as the anode source material. After the deposition process is complete, captured material is recovered for future reuse by removing the anode shield and re-processing it into anode source material. In another embodiment, unused source material condenses onto the inner surface of an containment collar and is gravitationally forced back toward the anode to be immediately vaporized for reuse. In a third embodiment, a geometric arrangement of substrates with an isotropic anodic arc at the center optimizes coating efficiency by maximizing the substrate area exposed to the vaporized material.

16 Claims, 10 Drawing Sheets

TO
VACUUM
PUMP

ANODIC ARC SOURCE CONTAINMENT MECHANISMS

RELATED APPLICATIONS

This application continuation-in-part of application Ser. No. 07/934,925, filed Aug. 25, 1992, now U.S. Pat. No. 5,302,271.

FIELD OF THE INVENTION

This invention relates to anodic arc containment systems, and more particularly to a new liquid anode source that provides greater processing control, and containment systems that minimize the anode source waste.

BACKGROUND OF THE INVENTION

The deposition of material upon a substrate by the use of an electric arc is well known. FIG. 1 depicts a typical deposition apparatus 10. The process takes place in a vacuum chamber 12 which encloses a substrate 14 which is to be coated and an electric arc electrode assembly 16, having an anode 18 and a cathode 20. Material 24 to be deposited is placed in a receptacle 26 formed in the cathode 20 of the electric arc electrode assembly 16. The substrate 14 to be coated is placed near the electric arc electrode assembly 16. A potential is applied between the anode 18 and the cathode 20 of the electric arc electrode assembly 16 and current flows between them, once the arc is ignited. As current flows between the cathode 20 and the anode 18, the material 24 to be deposited is vaporized and ionized forming an arc plasma 30 which maintains current flow even as the anode 18 and the cathode 20 are physically separated. The ions of the arc plasma 30 interact with the surface of the substrate 14 to be coated and are deposited thereupon. It should be noted, in the case where the cathode 20 is constructed from the material 24 to deposited, the cathode 20 need not contain a receptacle 26 and instead the cathode 20 itself is consumed in the deposition process. This form of deposition, in which material is deposited from the cathode region, may be termed cathodic vacuum arc deposition.

Alternatively, the anode 18 of the electric arc electrode assembly 16 may be used as the source of the material to be deposited. In such a case, where the material is deposited from the anode region, the deposition is referred to as anodic vacuum arc deposition.

In anodic vacuum arc deposition, an electric arc 30, which forms between the anode 18 and the cathode 20, is initiated by either mechanical or physical contact between the anode 18 and cathode 20, or the generation of an external energy source trigger to supply a high density plasma for non-mechanical ignition. Once the electric arc 30 forms or ignites, the anode 18 and the cathode 20 are separated and the arc is maintained, drawn, and focused by the material ionized during initiation.

Typically during the deposition process, the vaporized material to be deposited is discharged isotropically throughout the vacuum chamber and only a fraction of the material becomes deposited onto the substrate. A large portion of the material never reaches the substrate and is thereby wasted. When expensive materials, such as gold or platinum, are deposited using the methods of the prior art, the nondeposited excess material can represent a significant fraction of the cost of the materials.

SUMMARY OF THE INVENTION

An anodic vacuum arc deposition system is described herein for rapidly depositing a high quality, small grain size, coating on a substrate workpiece. The anodic vacuum arc deposition system includes a liquid anodic electrode which includes a continuous feed. The anodic vacuum arc deposition system includes an electric arc initiator and may be configured as a coaxial anode and cathode or as a separate high-density plasma trigger source positioned orthogonal to both the target and the anode/cathode electrodes. A plurality of coaxial electrodes may used to deposition coat a large area and/or to sequentially deposit a series of layers each of a different material.

Several material recovery systems including both methods and devices for recovery of the unused anodic arc coating material have also been developed. These systems minimize the anode source waste such that selective coatings may be applied with virtually all excess coating material recovered for reuse. The material recovery systems permit the deposition of expensive materials without the significant cost loss due to loss of material that occurs in deposition methods of the prior art. In addition, the recovery systems provide for minimal clean-up time and chamber contamination, reduced heat build-up to other chamber sections, and greater control over unwanted heat transfer or radiation.

BRIEF DESCRIPTION OF THE DRAWINGS

Other benefits and features of the invention can be more clearly understood with reference to the specification and the accompanying drawing in which.

DESCRIPTION OF THE PREFERRED EMBODIMENTS

Figure 2:
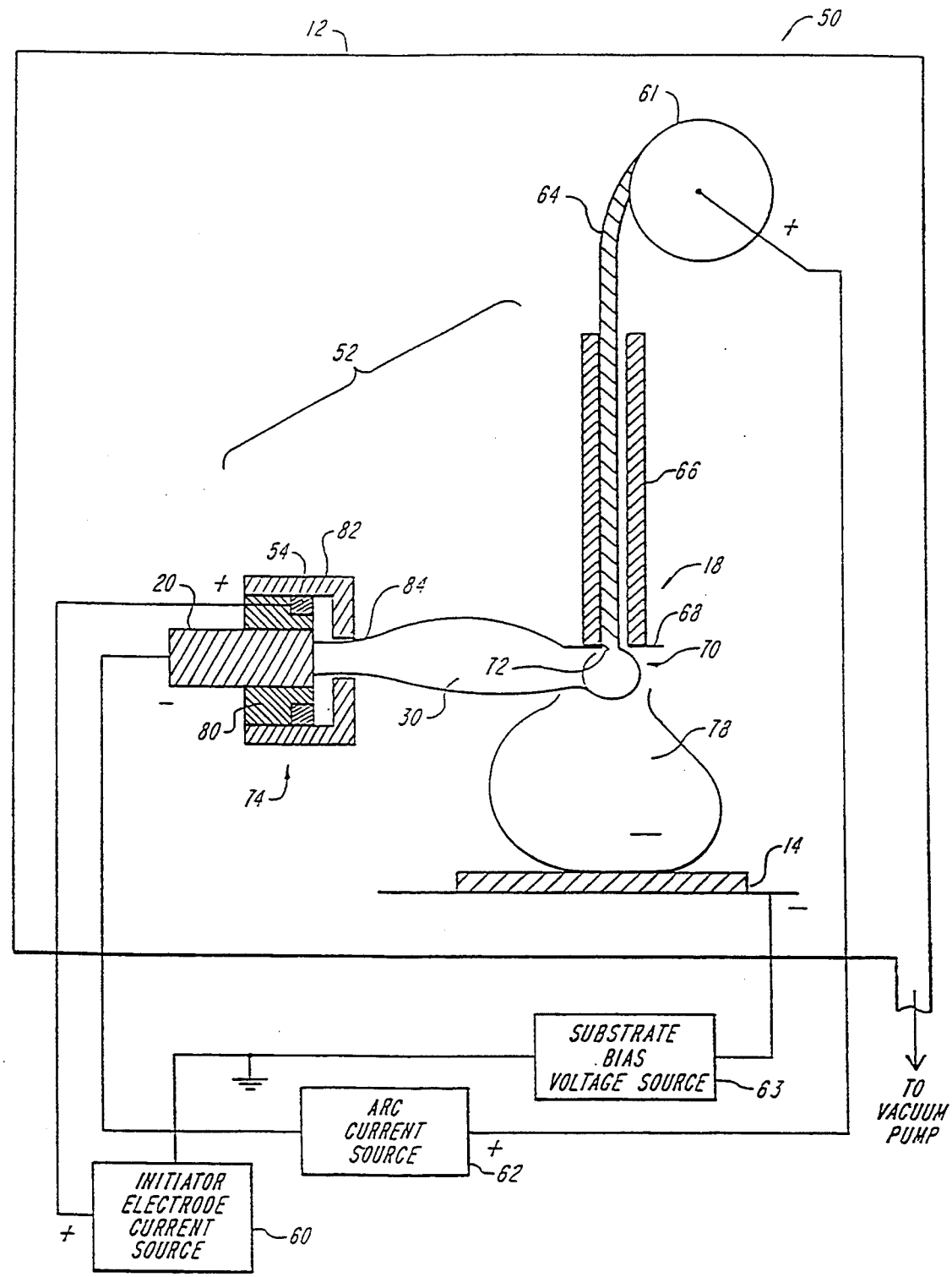
FIG. 2 depicts an embodiment of the anodic vacuum arc system of the invention.

Referring to FIG. 2, an embodiment 50 of the anodic vacuum arc system of the invention, in brief overview, includes a vacuum chamber 12 which encloses a substrate 14 to be coated and an electric arc electrode assembly 52, having an anode electrode 18, a cathode electrode 20 and an initiator electrode 54. In one embodiment the vacuum chamber 12 is maintained at $10^{-5}$ Torr. An initiator electrode current source 60 and an arc current source 62 provide the current necessary for initiating and sustaining, respectively, the electric arc 30. A substrate bias voltage source 63 provides a negative bias voltage to the substrate 14. The substrate bias voltage may be varied between 0 and −400 volts to provide an ion assist to the deposition material. The specific bias voltage used is determined by the specific substrate and the specific coating being deposited. Typically a high voltage provides the ion assist required for high adhesion However, too high a bias voltage may result in ion implantation rather than surface coating and may result in the arc discharge shifting from between the anode 18 and the cathode 20, to between the anode 18 and the substrate 14.

Considering the electric arc electrode assembly 52 in more detail, and remembering that the values discussed are exemplary, the anode 18 of the electric arc electrode assembly 52 includes a spool 61 of anodic wire 64 which is 0.2 cm in diameter. The spool 61 is connected to the positive terminal of the arc current source 62 in such a way that current from the arc current source 62 is permitted to flow through the anodic wire 64. The non-spooled end of the anodic wire 64 passes through an insulating tube 66, which has an outer diameter of 0.5 cm, and which is terminated at one end by an insulating limiter 68. The insulating limiter 68 includes an aperture 72 through which current flows between the cathode 20 and the anode 18.

When the electric arc 30 forms, the anodic wire 64 melts, forming a ball 70 of molten material adjacent the insulating limiter 68. As the anodic wire 64 is vaporized and ionized, the spool 61 is rotated so as to feed the anodic wire 64 through the insulating tube 66 at the same rate as material is being vaporized and ionized from the ball 70 of molten material to form a deposition vapor 78. This keeps the ball 70 of molten material adjacent the limiter 68 and constantly provides new liquid anodic material for deposition.

It is the liquefaction of the anode material that is the reason that the anode configuration is termed a liquid anode. An anode may be a liquid anode provided that the anode is small enough to permit the heat generated by the current to build up sufficiently to melt the anodic material. Additionally, the cathode 20, which is discussed below, must be large enough and/or be provided with cooling means such that the cathode material does not melt.

The size of the ball 70 of molten material is determined by the surface tension of the molten material, the degree to which the molten material will adhere to the anodic wire 64 and the temperature of the molten material. The first two properties are determined by the material to be deposited and hence the size of the ball 70 can be controlled by maintaining the current flow such that the material reaches its melting temperature but does not lose so much surface tension that the molten ball 70 drops from the anodic wire 64.

It should be noted that although the electrode assembly is shown oriented vertically, such need not be the case. It should also be noted that the spool 61 need not be placed within the vacuum chamber 12 as long as the anodic wire 64 is permitted to enter the vacuum chamber 12 without affecting the vacuum. The spool 61 may be rotated at the proper rate by means of a motor either under the control of a feedback loop or at a precalculated rate.

Figure 4A:
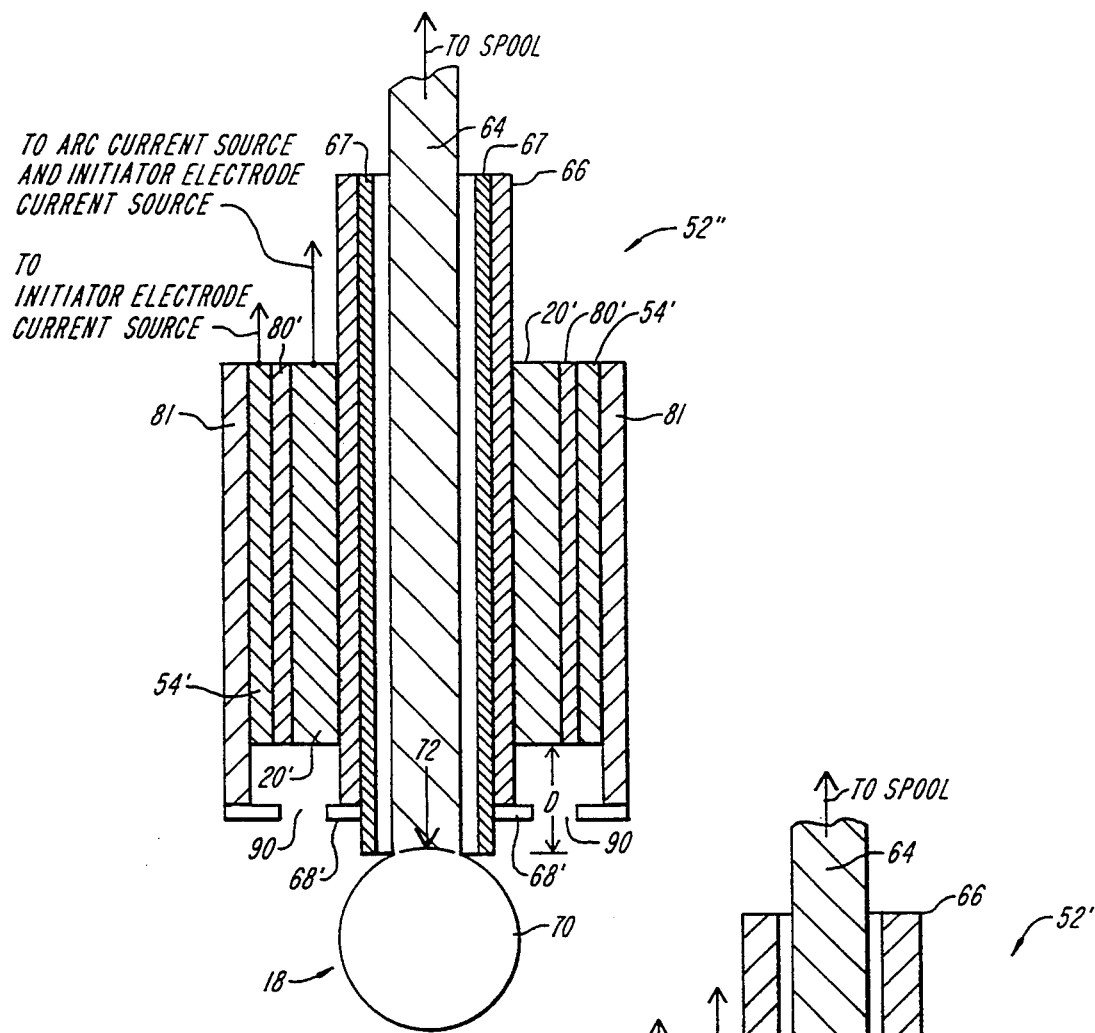
FIG. 4a is a cross-sectional diagram of another embodiment of a coaxial electrode assembly of the invention.

To deposit certain materials having a high melting temperature, such as tungsten or carbon, it may be necessary to provide an additional high temperature sink adjacent the insulating tube 66 to prevent the material of the insulating tube 66 from melting. FIG. 4a depicts an alternate embodiment of the anode assembly 52″ in which a tube of tungsten 67 separates the insulating tube 66 from the molten material 70. The tungsten tube 67 is of a size sufficient to dissipate heat and thereby prevent the insulating tube 66 from melting.

The cathode portion 74 of the electric arc electrode assembly 52 includes a cylindrical cathode 20 0.5 cm in diameter, which is electrically connected to the negative terminal of the arc current source 62 and which is electrically insulated from and encircled by an annular initiator electrode 54, which is 0.1 cm in thickness. The initiator electrode 54 is insulated from the cathode by 0.1 cm of insulation 80. The initiator electrode 54 is connected to the positive terminal of the initiator electrode current source 60. Both the initiator electrode 54 and the cathode 20 are partially enclosed by an insulating shield 82 having a shield aperture 84. The shield aperture 84 is oriented such that the electric arc 30 is permitted to form between the anode 18 and the cathode 20 while substantially preventing any material of the cathode 20, which may be vaporized by the arc, from reaching the substrate 14. In one embodiment the shield aperture 84 is 0.4 cm in diameter when the anode 18 and the cathode 20 are separated by about 2 cm. The shield 82 may be made of any high temperature-withstanding material such as ceramic or alternatively the shield may be made of a metal which is well insulated from the cathode 20 and the initiator electrode 54.

Material, vaporized and ionized from the anode 18, is drawn by the bias voltage applied to the substrate 14 by the substrate bias voltage source 63. The substrate 14 is separated from the ball 70 of molten material by about 20 cm.

Figure 1:
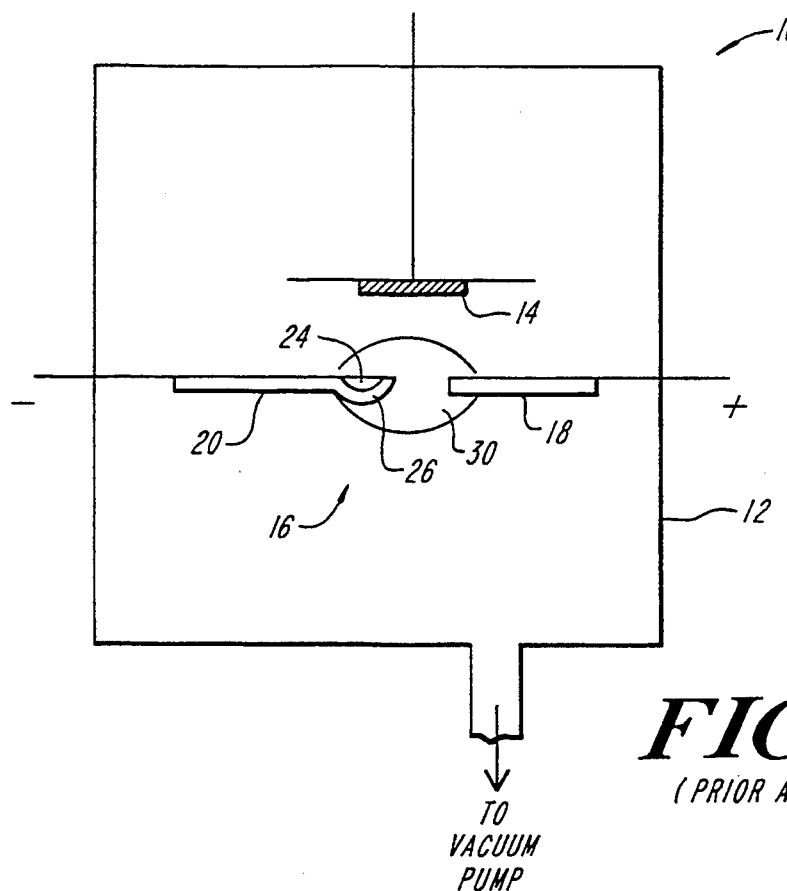
FIG. 1 depicts a cathodic vacuum arc system known to the prior art.
Figure 3A:
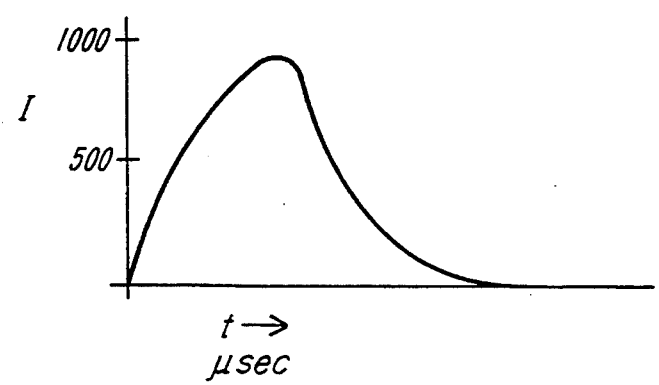
FIG. 3a is a graph of current through a resistor in the embodiment shown in FIG. 3 plotted against time.
Figure 3:
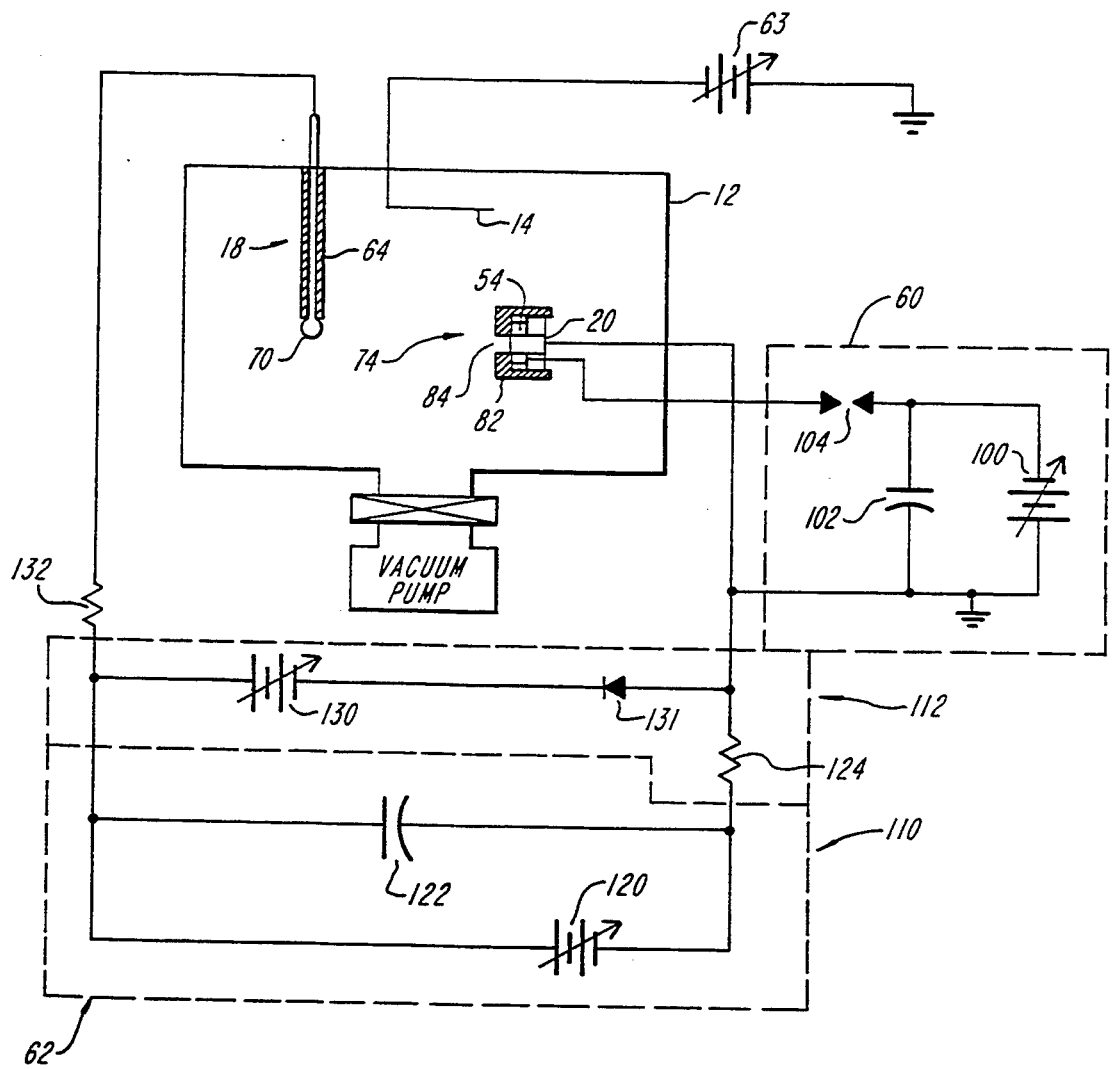
FIG. 3 is a schematic diagram of an embodiment of the external power circuits of the embodiment of the invention shown in FIG. 2.

FIG. 3 depicts the electronic components of the anodic vacuum arc system in more detail. The initiator electrode current source 60 includes a high voltage supply 100, a trigger capacitor 102 and a spark gap 104. The high voltage supply 100, producing 10K volts, charges the 0.1 $\mu$F trigger capacitor 102, which discharges across the 1 mm spark gap 104 and ionizes a path between the initiator electrode 54 and the cathode 20. The value of the trigger capacitor, 102, the voltage supplied by the high voltage supply 100 and the size of the spark gap 104 may be varied as required. In one embodiment, adding a 3 to 10 megohm resistor between the spark gap 104 and the initiator electrode 54 in parallel to ground reduces the voltage from the high voltage power supply to approximately 5 kV by forcing the spark gap 104 to discharge to the high resistance ground while simultaneously initiating the arc in a more controlled fashion.

The arc current source 62 includes an arc initiation portion 110 and an arc sustaining portion 112. The arc initiation portion 110 includes an arc initiation supply 120 and an arc initiation capacitor 122. The arc initiation capacitor 122, in one embodiment 2500 μF, is charged by the 200 V, 1 A current limited arc initiation supply 120. When the trigger capacitor 102 and spark gap 104 of the initiator electrode current source 60 discharge, thereby forming a plasma between the initiator electrode 54 and the cathode 20, the resulting ions permit the arc initiation capacitor 122 to discharge between the anode 18 and the cathode 20 establishing a current path. Current flows between the anode 18 and cathode 20 through a 0.25 Ω ballast resistor 132.

FIG. 3a depicts the current versus time profile of the current through a 0.1 Ω limiting resistor 124 which occurs as a result of the discharge of the arc initiation capacitor 122. Once the current path between the anode 18 and the cathode 20 is formed, the arc sustaining portion 112 of the arc current source 62 maintains current flow between the anode 18 and the cathode 20. The arc sustaining portion 112 includes a current limited arc current supply 130 and a diode 131. The current limited current supply 130 produces less than 200 A at up to 100 V.

Thus, to form the electric arc for deposition, the trigger capacitor 102 and the initiation capacitor 122 are charged by their respective power supplies. The trigger capacitor 102 discharges across the initiator electrode 54 and the cathode 20, forming an ionized path. The presence of ions permits the initiation capacitor 122 to discharge across the anode 18 and the cathode 20, forming an arc between the two. This arc is sustained by current supplied by the current limited arc current supply 130. The cycle in which initiation capacitor 122 and the trigger capacitor 102 are charged and discharged may be repeated until initiation of the electric arc between the anode 18 and the cathode 20 is sustained at steady state.

Figure 4:
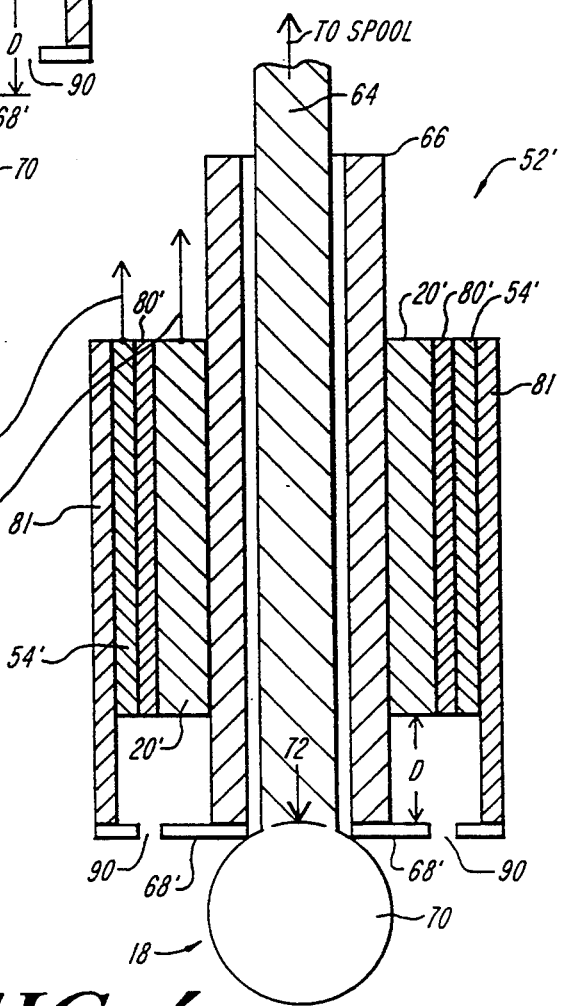
FIG. 4, is a cross-sectional diagram of an embodiment of a coaxial electrode assembly of the invention.

Although the anode 18 and the cathode 20 in the previous embodiment are depicted as separate units, such is not a requirement. An embodiment of a coaxial electrode assembly 52' in which an anode 18, a cathode 20', and an initiation electrode 54' are coaxially disposed is shown in FIG. 4. This coaxial electrode assembly 52' has at its center a 0.2 cm diameter anodic wire 64 movably positioned within a 0.5 cm outer diameter insulating tube 66 as in the previous embodiment.

An annular cathode 20' having an outer diameter of 0.7 cm is positioned concentrically about the insulating tube 66. An annular initiation electrode 54' having an outer diameter of 1.1 cm is in turn positioned concentrically about the cathode 20' and separated from the cathode 20' by an annular insulator 80' having an outer diameter of 0.9 cm. An insulator 81 having an outer diameter of 1.3 cm surrounds the coaxial electrode 52'. The cathode 20', the initiator electrode 54' and the insulator 80' are displaced from the end of the anode 18 at a distance (O), which in one embodiment is 0.3 cm. An insulating limiter 68', terminates one end of the coaxial electrode assembly 52'. The insulating limiter 68', includes a central aperture 72 for the anodic wire 64 and an annular aperture 90 for the cathode 20'. The scale of the embodiment in FIG. 4 is sufficient for anodic arc currents of less than 20 A, but dimensions must be scaled up for higher currents.

In this embodiment, as in the previous embodiment the trigger capacitor 102 discharges across the initiator electrode 54' and the cathode 20', permitting the initiation capacitor 122 to discharge across the anode 18 and the cathode 20' forming an electric arc. As the arc is sustained the anodic material melts forming a molten ball 70 from which the anodic metal vapor/plasma expands.

Figure 5:
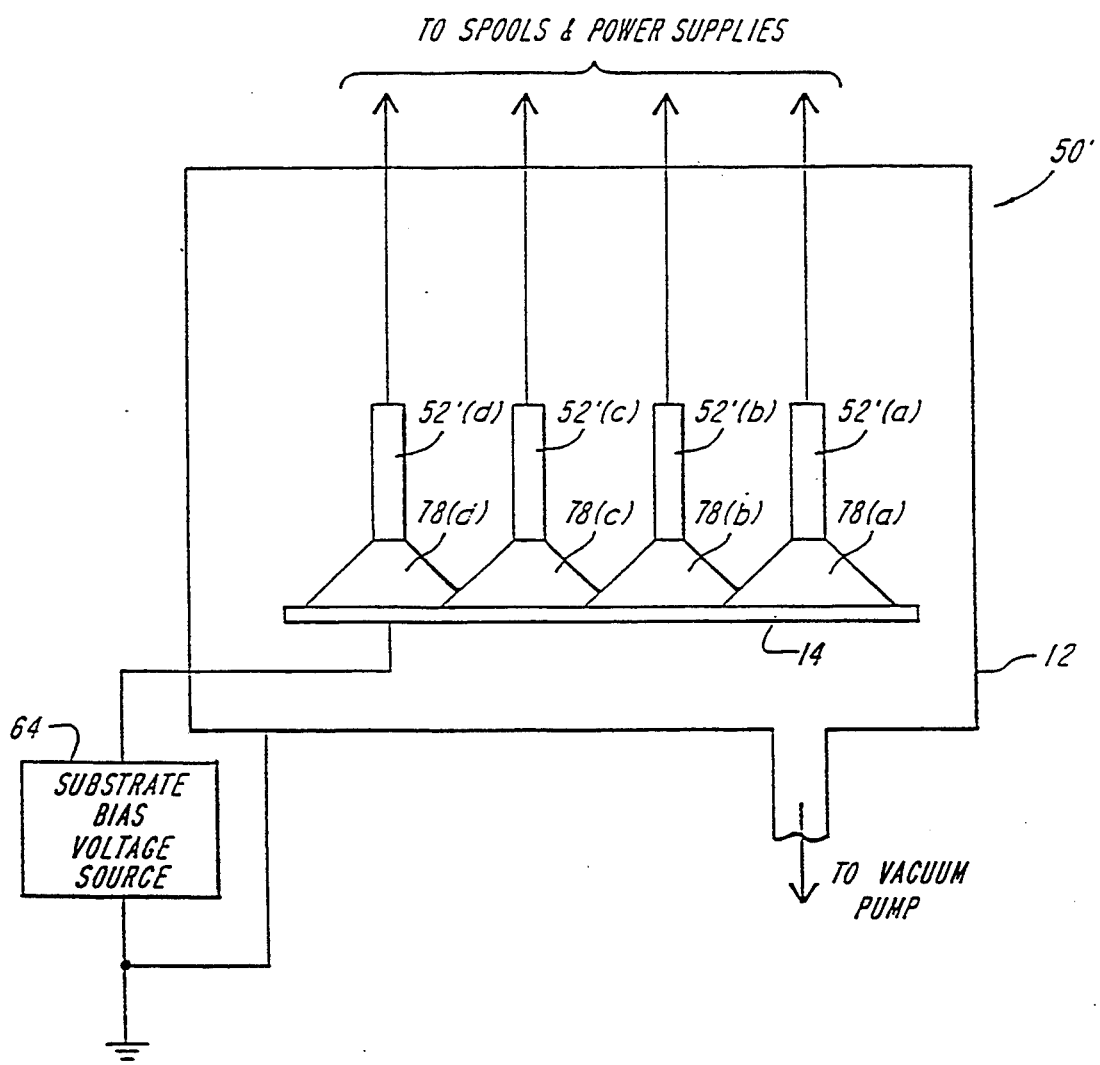
FIG. 5 is a highly schematic diagram depicting an embodiment of the invention utilizing a plurality of anodic vacuum arc electrodes.

One of the benefits of the coaxial electrode assembly 52' is that its small physical size permits several of the assemblies to be positioned adjacent one another. FIG. 5 depicts an arrangement of coaxial electrodes 52'(a)–52'(d) positioned adjacent a substrate 14 so as to provide increased area coverage. The coaxial electrode assemblies 52' are arranged such that the deposition vapor 78(a)–78(d) from each of the coaxial electrode assemblies 52' partially overlap. As in the previous embodiments each coaxial electrode assembly 52' has its own anodic wire spool (not shown). This arrangement provides a substantially uniform coating because the deposition profile is a cosine function with the highest deposition concentration directly beneath the coaxial electrode. Thus, the overlap of the deposition vapor from each electrode assembly 52' contributes to the uniformity of the coating.

Figure 6:
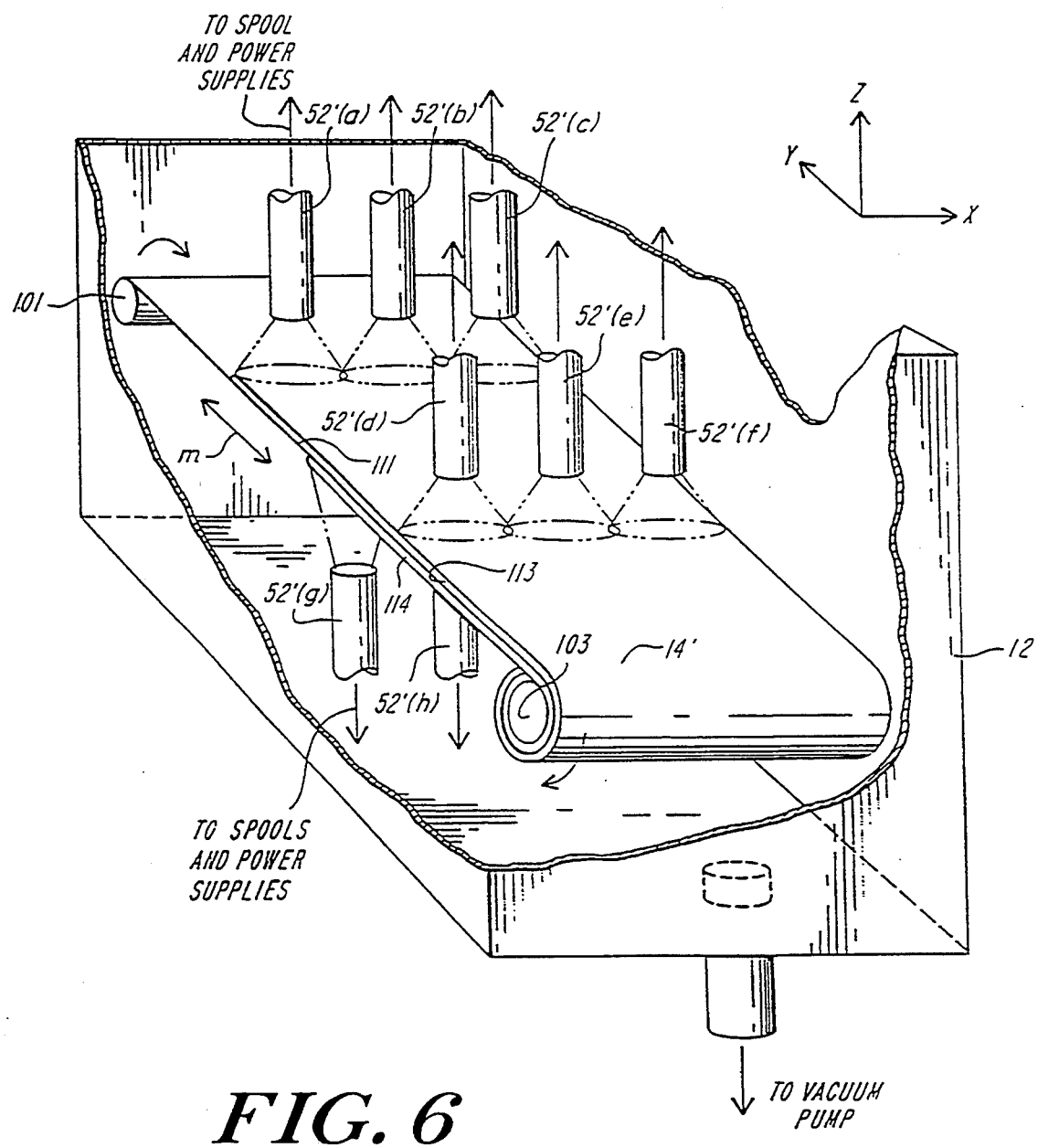
FIG. 6 is a perspective diagram depicting an embodiment of the invention utilizing a plurality of anodic vacuum arc electrodes for depositing a plurality of layers on a webbing substrate.

In addition to providing increased area coverage, multiple coaxial electrode assemblies 52' may be used to sequentially deposit different layers of materials on a substrate. An embodiment of the invention which permits multiple layers to be deposited as well as permitting the deposition coating of both sides of the substrate is shown in cutaway perspective in FIG. 6. In this embodiment the substrate to be coated is shown as a web substrate 14' which is played off a first reel 101 and taken up on a second reel 103. Although the reels 101, 103 are depicted as being located within a vacuum chamber 12, this need not be the case as long as the vacuum of the vacuum chamber is maintained. The reels 101, 103 are separated and are driven in such a way to permit the substrate 14' to move (arrow m) from one reel 101 to the other 103 while passing adjacent a plurality of coaxial electrodes 52'. Again each coaxial electrode is attached to its own anodic spool (not shown).

In the embodiment shown the coaxial electrodes grouped together along the width of the chamber, the x-axis, for example 52'(a), 52'(b), 52'(c), are all depositing the same material and are arranged so as to provide the width of coverage required by the width of the substrate 14'. The different groups of coaxial electrodes located along the length of the chamber, the y-axis, each deposit a different material onto the substrate 14'. Thus, for example, the first group of coaxial electrodes 52'(a), 52'(b), 52'(c), would first deposit a layer of aluminum 111 on the substrate 14' as the substrate 14' passes below the coaxial electrodes 52'(a), 52'(b), 52'(c). Then the second group of coaxial electrodes 52'(d), 52'(e), 52'(f) would deposit a second material 113 such as copper upon the layer of aluminum 111 just deposited on the substrate 14'. In addition, other coaxial electrodes, for example 52'(g), 52'(h), can be used to simultaneously deposit layers of material 114 on the other surface of the substrate 14'.

In order to minimize waste of depositing material, recovery systems may be employed to recover the material generated by an anodic arc that is not deposited onto the substrate. An embodiment of an anodic arc recovery apparatus 120, illustrated in FIG. 7, includes an anode 128 and anode source material 130, a cathode 132, an anode shield 122, and an insulator 124. The insulator 124 electrically isolates the anode shield 122 from the anode 128.

The anode shield 122 is made of the same material as the anode source material 130, and may be in any geometric shape, for example cylindrical or cubic. Alternatively, the anode shield may be made of a material possessing a higher melting temperature than the deposited material. An aperture 126 is located in the anode shield 122 between the anode source material 130 and a substrate 127 to allow vaporized material to pass through the anode shield 122 and be deposited on the substrate. The anode 128, including the anode source material 130, is placed between the anode shield 122 electrically isolated by the anode insulator 124, proximate the cathode 132 and cathode shield 134.

Figure 7:
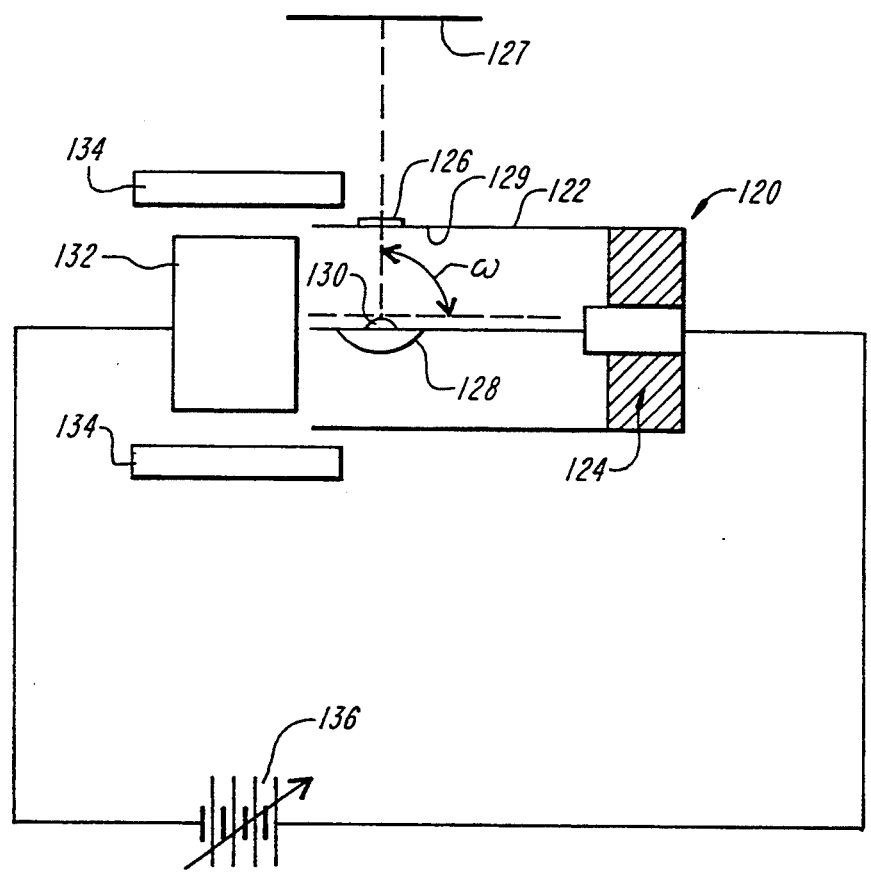
FIG. 7 depicts an embodiment of the anodic arc source containment mechanism of the invention.

Upon ignition of the anodic arc and application of power from a power source 136, vaporized material from the anode source 130 passes through the aperture 126 and is deposited onto the substrate 127. The size of the aperture 126 is variable, and can be determined by the desired solid angle of deposition for optimal coverage of the substrate 127. As illustrated in FIG. 7, a normal to the plane of the anode extends through the aperture 126 and intersects the anode source 130 to establish an angle $\omega$. When the anode source material 130 is aligned with the aperture 126 and the substrate 127, $\omega$ is 90°. $\omega$ may be varied as a function of the placement of the anode 128 and anode source material 130 within the anode shield 122. Vaporized material not passing through the aperture 126 is deposited on the inner surface 129 of the shield during the deposition process. In use, the anode shield aperture does not become clogged due to aperture size, radiant heating, and a deposition run time of typically less than 5 minutes.

After the deposition process is complete, captured material is recovered for future reuse by removing the anode shield 122 and reprocessing it into anode source 130. This recovery method is particularly effective if the anode shield 122 and the source 130 are the same material. Alternatively, processing may occur to exclusively remove the recovered anode material through various selective wet or dry chemical etching techniques. Alternatively, if the anode shield 122 and the anode source 130 are different materials, the anode shield containing the deposited material may be heated to a temperature between the melting temperatures of the deposited material and the material of the anode shield itself, thereby permitting the material on the inner surface 129 of the anode shield 122 to be recovered without melting the anode shield.

In an illustrative embodiment, a copper anode source 128 and a tubular copper shield 122 with a 3 mm aperture 126 are used to deposit vaporized copper onto a silicon wafer substrate 127. The distance from the source material 130 to the aperture 126 is approximately 1 cm, and a 3 inch diameter silicon wafer substrate 127 is placed approximately 5 cm from the aperture 126. The anodic arc is run at a current of approximately 70 amperes for approximately one minute. Vaporized copper material that did not flow through the aperture 126 is retained by the tubular copper shield 122, and is recovered and used as source material for subsequent processes. Under these conditions, the tubular copper anode shield 122 recovers approximately 93% of the copper to be deposited while directing 7% of the copper vapor away from the assembly (including the aperture and the space between the anode and cathode). Of the 7% of the copper vapor directed away, 1.6% migrated through the aperture 126 and was deposited onto the 3 inch wafer substrate 127. The remaining 5.4% is unrecoverable. Based on these data, the anodic arc recovery apparatus permits up to 95% of the original source material to be deposited or recovered, and limits the total amount of vaporized material lost to approximately 5%.

Figure 8:
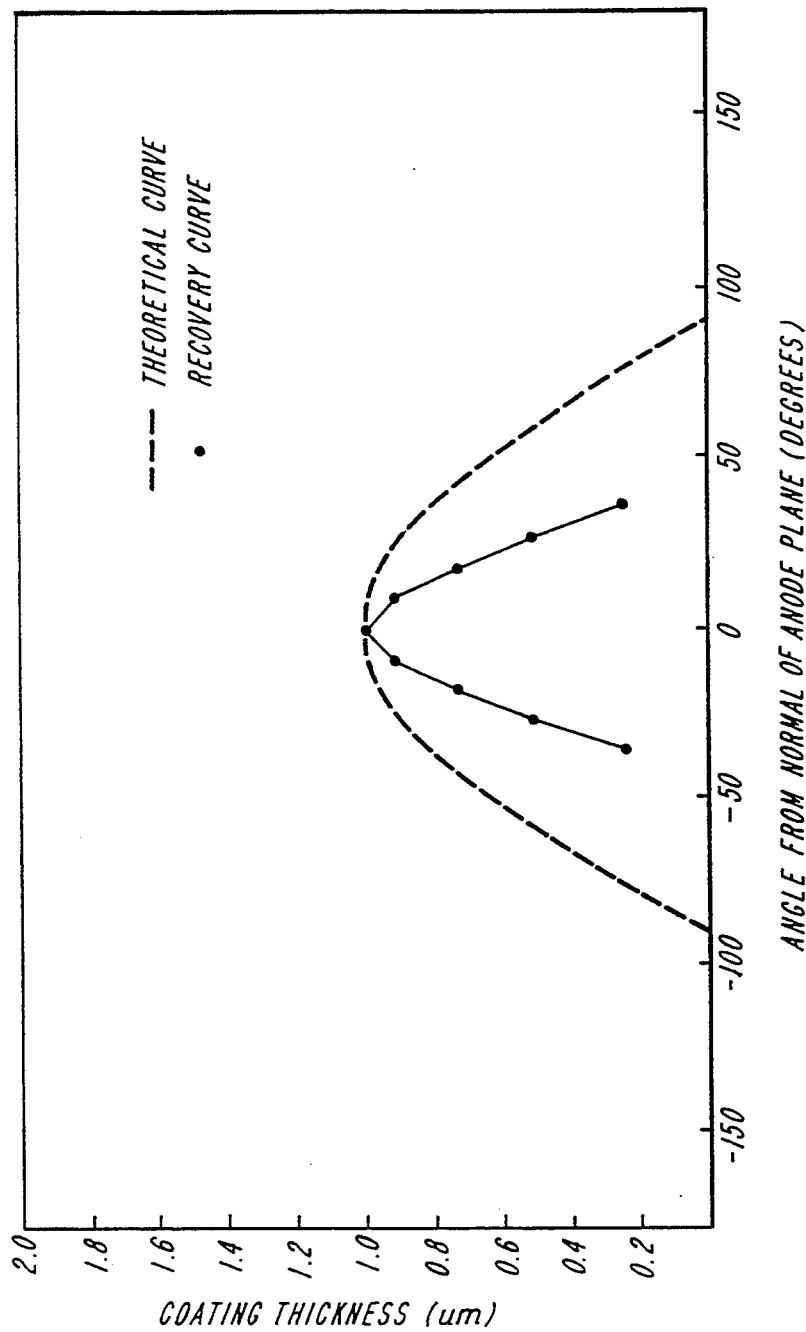
FIG. 8 is a graph depicting coating coverage as a function of angle deviation in the embodiment of the anodic arc source containment mechanism of the invention of FIG. 7.

Preferably, the anode source 130 is positioned directly below the aperture 126 in order to maximize the amount of material flowing through the aperture 126. However, some applications may require that the anode source 130 be located in other positions. FIG. 8 illustrates coating coverage as a function of angle deviation as measured from normal to the anode plane, herein defined as $\omega$. Approximately 92% of the coating is kept to within 60% of the substrate surface aligned with the normal of the center of the aperture plane. An anodic arc recovery apparatus with the above-described dimensions can therefore direct a coating to within 2 standard deviations (SD) of the angle distribution. In addition, the anode source 130 may be placed closer or farther away from the aperture 126, thereby affecting the solid angle of coverage onto the substrate. In general, as the distance between the anode source 130 and the aperture 126 increases, the solid angle of coverage becomes more acute and more vaporized material is captured on the inner surface of the anode shield 129.

Figure 9:
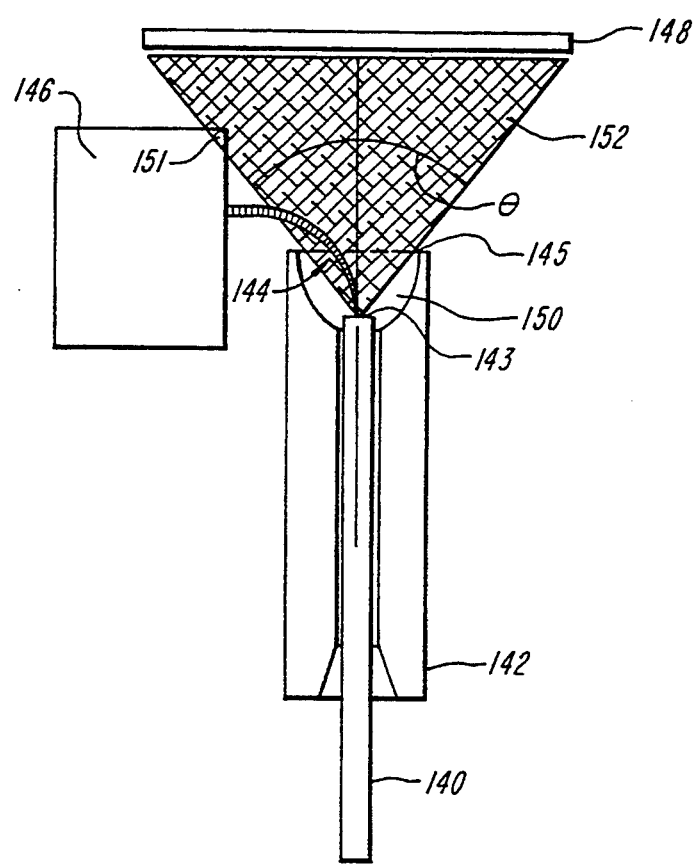
FIG. 9 depicts another embodiment of the anodic arc source containment mechanism of the invention.

In another embodiment, illustrated in FIG. 9, a long term steady state recovery system can be employed that simultaneously collects and redirects unused, recovered source material to the arc. In this embodiment, a large fraction of the vaporized material that is not deposited onto the substrate is available for immediate reuse. This embodiment eliminates the down-time needed for completion of the recovery cycle of the unused material via shield replacement and the cost of reclaiming the unused material. At the same time, this process reduces the expense of the raw anode source material and increases the material use efficiency.

As illustrated in FIG. 9, a cylindrical anode 140 of solid metal wire, such as aluminum, is fed through a containment collar 142, preferably made of alumina. Alternatively, the collar 142 may be made of a ceramic or any other high temperature, non-reactive, insulative material. The containment collar 142 includes a curved (e.g., spherical or parabolic) aperture 150 that captures some of the vaporized material from the cylindrical anode 140 and allows it to be reused continuously. The solid angle of coverage 152 is established as a function of the parameters of the containment collar 142 and the aperture 150. An arc 144 is established between the cylindrical anode 140 and the cathode 146, and the anode material is vaporized and deposited onto a substrate 148.

The reclamation process of unused material occurs as the vaporized material which condenses onto the inner surface of the containment collar 142 is heated by the arc 144 so that the material remains in a liquid state and is gravitationally forced back toward the anode spot 143 to be immediately vaporized for reuse.

Containment efficiencies are optimized by controlling several operating parameters. First, the deposition rate is optimized by matching the rate of vaporization of the anode 140 with the rate of the anode feed. Matching of rate of evaporation with the rate of feed minimizes waste material and reduces the possibility of a feed jam. Second, the configuration of the containment collar 142 and desired solid angle of coverage $\theta$ is chosen to permit excess material to be recaptured and reused. As illustrated in FIG. 9, this embodiment includes a cylindrical anode 140 in combination with a curved aperture 150. The angle from the anode spot 143 from the long axis of the anode 140 to the inner exit edge 145 of the containment collar 142 is configured to deliver the desired solid angle $\theta$ of coating coverage 152 and minimize waste.

Cathode placement is also a critical factor in choosing a solid angle of coverage 152. The cathode 146 often partially blocks the solid angle of coverage 152 thereby limiting its coverage, a phenomenon known as shadowing or eclipsing (see FIG. 9 at 151). As shown in FIG. 9, the corner of the cathode 151 partially blocks the solid angle of coverage 152. To avoid this impediment, placement of the cathode 146 must be close enough to the containment collar 142 such that an arc 144 may be formed, but distant enough such that the solid angle of coverage 152 is not impaired. The distance between the containment collar 142 and the cathode 146 is determined by the arc length between the cathode 146 and the anode 142. Preferably, this dimension is approximately 2 to 7 mm. Cathode interference with deposition coverage can be minimized by rounding the cathode edges and placing the cathode 146 as low as possible from the solid angle coverage. In one embodiment, a "U"-shaped cut-out in the containment collar allows for lower and closer arc lengths from the cathode 146 to the anode 142.

Figure 10:
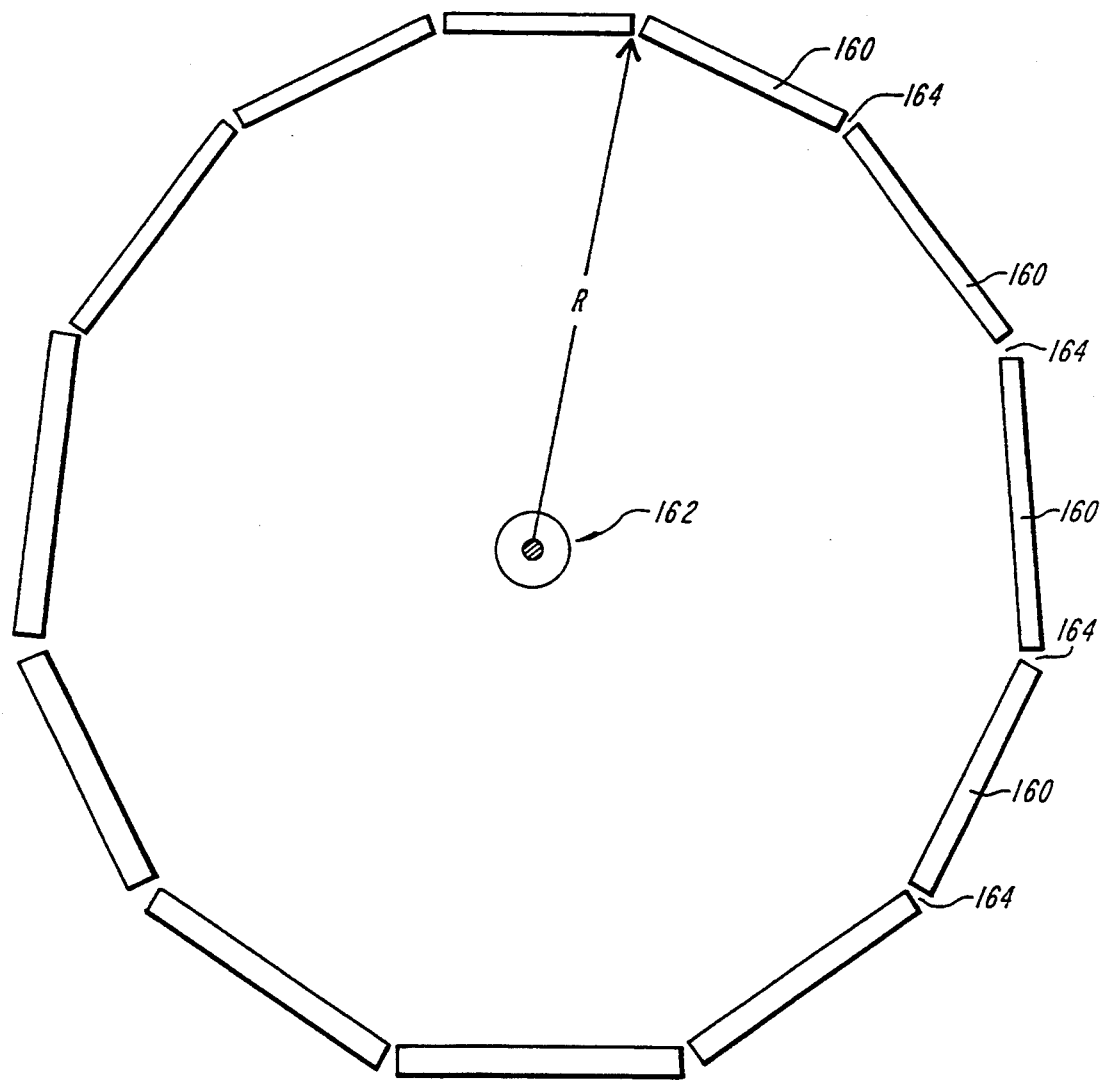
FIG. 10 depicts a third embodiment of the anodic arc source containment mechanism of the invention.

In a third embodiment, illustrated in FIG. 10, a geometric arrangement of substrates 160 with an isotropic anodic arc 162 at the center optimizes coating efficiency by maximizing the substrate area exposed to the vaporized material. As illustrated in cross-section in FIG. 10, a spherical arrangement of substrates maximizes the area exposed to the isotropic anodic arc 162. Other possible arrangements of substrates includes cylindrical or any shape following the shape of the isometric anode source. The only waste is the material collected by the cathode assembly and the interstitial spaces 164 of the individual substrates 160 composing the arrangement.

In an illustrative embodiment, an arc is established between the cathode and an adjacent anode. However, when an isotropic source is used, as illustrated in FIG. 10, the anode is centered about the cathode. The cathode may block (eclipse) the anode source vapors, and prevent a portion of the substrates 160 from becoming deposited with material, however this phenomenon accounts for only a very small area.

In one embodiment, approximately 75 three inch silicon wafers are mounted into two hemispheres. The two hemispheres are then further assembled to form a sphere. The dual hemispherical arrangement provides the user with ease of assembly and cleaning of the apparatus. An isotropic anodic arc source is placed at the center of the spherical arrangement approximately 18 cm from the substrates. During operation, approximately 20% of the anode source material is lost to the interstitial spaces between the substrates. Loss of anode source material may be reduced by providing larger individual substrates, thereby reducing the volume of interstitial space by reducing the volume of the sphere, or by providing a single, spherical or hemispherical substrate.

These and other examples of the concept of the invention illustrated above are intended by way of example and the actual scope of the invention is to be determined solely by from the scope of the following claims.

We claim:

1. An anodic arc deposition assembly including a material recovery system for recovery of anodic arc deposition coating material, comprising:

an anode assembly comprising anodic coating source material; and an anode shield surrounding said anodic coating source material, said anode shield defining an aperture, said aperture aligned between said anodic source material and a substrate during coating, said anode shield positioned to collect said anodic coating source material evaporating from said anode assembly and not passing thorough said aperture.

2. The assembly of claim 1, wherein said anode shield comprises said anodic source material.

3. The assembly of claim 1, wherein said anode shield comprises material having a higher melting temperature than said anodic source material.

4. An anodic arc deposition assembly including a material recovery system for recovery of anodic arc deposition coating material, comprising:

an anode adapted to provide a source of said coating material; and a containment collar having a first end and a second end, said second end including a depression, said anode positioned within said containment collar from said first end to said second end, said depression adapted for capturing a non-deposited portion of said anodic arc deposition coating material.

5. The assembly of claim 4, wherein said anode includes a free first end, said free first end positioned within said depression for capturing a portion of said anodic arc deposition coating material.

6. The assembly of claim 4, wherein said containment collar is made of an insulative, high-temperature resistant material.

7. The assembly of claim 4, wherein said containment collar comprises alumina.

8. An anodic arc deposition system for deposition of a coating material on a plurality of substrates, comprising:

an anode adapted to provide an isotropic anodic arc, said anode comprising a source of said coating material; and holders adapted to mount a plurality of substrates disposed around said anode, whereby said plurality of substrates are arranged so that the spaces between said plurality of substrates are minimized.

9. The anodic arc deposition system of claim 8, wherein said arrangement is spherical.

10. The anodic arc deposition system of claim 8, wherein said arrangement is hemispherical.

11. A method to recover anodic arc deposition coating material, comprising:

providing an anode assembly comprising anode source material;

providing an anode shield surrounding said anodic source material, said anode shield defining an aperture, said aperture aligned between said anodic source material and a substrate;

vaporizing said anode source material, a first portion of said vaporized anode source material flowing through said aperture and depositing on said substrate, a second portion of said vaporized anode source material depositing on the inner surface of said anode shield;

recovering said second portion of said vaporized anode source material; and reprocessing said recovered second portion of said vaporized anode source material into said anode source material.

12. The method of claim 11, wherein said anode shield comprises said anodic source material and said recovery step includes melting said anode shield.

13. The method of claim 11, wherein said anode shield is made from material having a higher melting temperature than said anodic source material and said recovery step includes heating said anode shield to melt said second portion of said vaporized anode source material.

14. The method of claim 11, wherein said recovery step includes chemical etching of said second portion of said vaporized anode source material from said anode shield.

15. A method to recover anodic arc deposition coating material, comprising:

providing an anode material and a containment collar, said containment collar having a first end and a second end, said second end including a depression, said anode material positioned within said containment collar from said first end to said second end;

vaporizing said anode material, said vaporized anode material comprising a first portion and a second portion, said first portion of said vaporized anode material depositing onto a substrate, said depression collecting said second portion of said vaporized anode material for reuse as said anode material.

16. The method of claim 14, wherein said collection step includes condensing said second portion of said vaporized anode material on said depression and directing said condensate to said anode source material.

* * * * *